United States Patent
Labelle et al.

US009175183B2

(10) Patent No.: US 9,175,183 B2
(45) Date of Patent: Nov. 3, 2015

(54) TRANSPARENT CONDUCTIVE FILMS, METHODS, AND ARTICLES

(75) Inventors: Gary E. Labelle, Stillwater, MN (US); Richard R. Ollmann, Woodbury, MN (US)

(73) Assignee: Carestream Health, Inc., Rochester, NY (US)

( * ) Notice: Subject to any disclaimer, the term of this patent is extended or adjusted under 35 U.S.C. 154(b) by 585 days.

(21) Appl. No.: 13/450,678

(22) Filed: Apr. 19, 2012

(65) Prior Publication Data

US 2012/0301737 A1   Nov. 29, 2012

Related U.S. Application Data

(60) Provisional application No. 61/488,831, filed on May 23, 2011.

(51) Int. Cl.

| | |
|---|---|
| B32B 23/04 | (2006.01) |
| B32B 23/08 | (2006.01) |
| B32B 23/14 | (2006.01) |
| B32B 23/20 | (2006.01) |
| B32B 27/08 | (2006.01) |
| B32B 27/18 | (2006.01) |
| B32B 27/36 | (2006.01) |
| C08K 3/00 | (2006.01) |
| C08K 3/08 | (2006.01) |
| C08K 7/06 | (2006.01) |
| C08L 1/08 | (2006.01) |
| C08L 1/12 | (2006.01) |
| C08L 1/14 | (2006.01) |
| C08L 67/00 | (2006.01) |
| C09D 5/24 | (2006.01) |
| C09D 101/10 | (2006.01) |
| C09D 101/12 | (2006.01) |
| C09D 101/14 | (2006.01) |
| C09D 167/00 | (2006.01) |
| H01B 1/20 | (2006.01) |
| H01B 1/22 | (2006.01) |
| C08G 63/16 | (2006.01) |
| C08G 63/183 | (2006.01) |
| C08G 63/78 | (2006.01) |
| C08G 63/88 | (2006.01) |
| H01L 31/18 | (2006.01) |
| B82Y 30/00 | (2011.01) |
| H01L 31/0224 | (2006.01) |
| H01L 31/0392 | (2006.01) |
| C08J 7/04 | (2006.01) |
| C08L 1/10 | (2006.01) |

(52) U.S. Cl.
CPC .............. *C09D 101/12* (2013.01); *B32B 23/04* (2013.01); *B32B 23/08* (2013.01); *B32B 23/20* (2013.01); *B32B 27/08* (2013.01); *B32B 27/36* (2013.01); *B82Y 30/00* (2013.01); *C08J 7/042* (2013.01); *C09D 101/14* (2013.01); *H01L 31/022466* (2013.01); *H01L 31/0392* (2013.01); *H01L 31/1884* (2013.01); *B32B 23/14* (2013.01); *B32B 27/18* (2013.01); *B32B 2255/10* (2013.01); *B32B 2255/26* (2013.01); *B32B 2255/28* (2013.01); *B32B 2307/202* (2013.01); *B32B 2307/412* (2013.01); *B32B 2307/7242* (2013.01); *B32B 2307/7265* (2013.01); *B32B 2367/00* (2013.01); *B32B 2457/20* (2013.01); *C08G 63/16* (2013.01); *C08G 63/183* (2013.01); *C08G 63/78* (2013.01); *C08G 63/88* (2013.01); *C08J 2367/02* (2013.01); *C08J 2401/10* (2013.01); *C08K 3/0008* (2013.01); *C08K 3/0066* (2013.01); *C08K 3/08* (2013.01); *C08K 7/06* (2013.01); *C08K 2003/0806* (2013.01); *C08K 2201/001* (2013.01); *C08L 1/10* (2013.01); *C08L 1/12* (2013.01); *C08L 1/14* (2013.01); *C08L 67/00* (2013.01); *C08L 2201/10* (2013.01); *C09D 5/24* (2013.01); *C09D 101/10* (2013.01); *C09D 167/00* (2013.01); *H01B 1/20* (2013.01); *H01B 1/22* (2013.01); *Y02E 10/50* (2013.01); *Y10T 428/3179* (2015.04)

(58) Field of Classification Search
None
See application file for complete search history.

(56) References Cited

U.S. PATENT DOCUMENTS

| | | | |
|---|---|---|---|
| 4,725,479 A | | 2/1988 | Utsumi |
| 5,366,544 A | * | 11/1994 | Jones et al. .............. 106/170.49 |
| 5,444,144 A | * | 8/1995 | Tanaka et al. ................. 528/503 |
| 5,498,454 A | | 3/1996 | Kuze et al. |
| 5,545,364 A | * | 8/1996 | Song et al. .................. 264/210.5 |
| 6,020,056 A | | 2/2000 | Walker et al. |
| 6,140,030 A | * | 10/2000 | Anderson et al. ............. 430/529 |
| 7,190,354 B2 | * | 3/2007 | Tanaka et al. ................. 345/173 |
| 7,339,793 B2 | | 3/2008 | Foster et al. |

(Continued)

FOREIGN PATENT DOCUMENTS

| | | |
|---|---|---|
| EP | 1 965 438 A2 | 9/2008 |
| JP | 2004-285332 | * 10/2004 |

(Continued)

OTHER PUBLICATIONS

Joseph V. Koleske, A Radiation-Cure Primer, Journal of Coatings Technology, vol. 69, No. 866, Mar. 1997, pp. 29-38.

*Primary Examiner* — Vivian Chen
(74) *Attorney, Agent, or Firm* — Reed L. Christiansen

(57) ABSTRACT

Disclosed are compositions and methods that provide flexible transparent conductive films that exhibit low levels of oligomer migration and haze development, without making use of costly substrates based on PEN film or PET films having low oligomer content. Such flexible transparent conductive films are useful in electronic and optical applications.

9 Claims, No Drawings

(56) References Cited

U.S. PATENT DOCUMENTS

| | | | |
|---|---|---|---|
| 7,719,007 B2* | 5/2010 | Tompkins et al. | 257/48 |
| 7,901,746 B2* | 3/2011 | Noguchi et al. | 428/1.5 |
| 8,018,563 B2* | 9/2011 | Jones et al. | 349/139 |
| 8,018,568 B2* | 9/2011 | Allemand et al. | 349/187 |
| 8,049,333 B2* | 11/2011 | Alden et al. | 257/741 |
| 8,052,773 B2* | 11/2011 | Takada | 75/371 |
| 8,094,247 B2* | 1/2012 | Allemand et al. | 349/12 |
| 8,198,796 B2* | 6/2012 | Takada | 313/352 |
| 8,486,537 B2* | 7/2013 | Whitcomb et al. | 428/433 |
| 2003/0170456 A1* | 9/2003 | Anderson et al. | 428/403 |
| 2003/0170492 A1* | 9/2003 | Anderson et al. | 428/690 |
| 2005/0058846 A1* | 3/2005 | Matsui et al. | 428/480 |
| 2007/0074316 A1* | 3/2007 | Alden et al. | 977/762 |
| 2007/0298243 A1* | 12/2007 | Suzuki et al. | 428/328 |
| 2008/0143906 A1* | 6/2008 | Allemand et al. | 349/43 |
| 2008/0259262 A1* | 10/2008 | Jones et al. | 349/139 |
| 2009/0130433 A1* | 5/2009 | Takada | 428/328 |
| 2009/0274902 A1 | 11/2009 | Kume | |
| 2010/0069535 A1* | 3/2010 | Suzuki et al. | 524/37 |
| 2010/0218822 A1* | 9/2010 | Yamasaki et al. | 136/256 |
| 2010/0243295 A1* | 9/2010 | Allemand et al. | 174/250 |
| 2010/0307792 A1* | 12/2010 | Allemand et al. | 174/126.1 |
| 2011/0018424 A1* | 1/2011 | Takada | 313/352 |
| 2012/0301733 A1* | 11/2012 | Eckert et al. | 428/458 |
| 2013/0341071 A1* | 12/2013 | Stebbins | 174/253 |

FOREIGN PATENT DOCUMENTS

| | | | |
|---|---|---|---|
| WO | WO 00/79544 | * | 1/2000 |
| WO | WO 2007/022226 | | 2/2007 |
| WO | WO 2010/129604 | | 11/2010 |
| WO | WO 2011/008226 | | 1/2011 |

* cited by examiner

TRANSPARENT CONDUCTIVE FILMS, METHODS, AND ARTICLES

CROSS REFERENCE TO RELATED APPLICATIONS

This application claims the benefit of U.S. provisional application No. 61/488,831, filed May 23, 2011, entitled TRANSPARENT CONDUCTIVE FILMS, METHODS, AND ARTICLES, which is hereby incorporated by reference in its entirety.

BACKGROUND

Transparent conductive films are finding widespread use in such applications as electronic and optical devices that exploit the films' transparency, conductivity, and stability. Providing transparent conductive films as coatings on flexible transparent substrates broadens their range of use.

Some flexible substrates that may be in common use in other coatings applications have found limited use for transparent conductive film applications. Standard grades of polyethylene terephthalate (PET) films, for example, can exhibit excessive migration of oligomers to film surfaces, often leading to increased haze due to the powdered deposits that can develop during processing.

Flexible films based on polyethylene naphthalate (PEN) are reported to exhibit low levels of oligomer migration and haze development relative to standard grades of PET film. See, for example, U.S. Pat. No. 4,725,479 to Utsumi, which is hereby incorporated by reference in its entirety. However, PEN films have higher raw material costs and can be more costly to manufacture than standard grades of PET films; they are generally sold at a premium.

Specialty grades of PET films that have low oligomer content are known. See, for example, U.S. Pat. No. 5,498,454 to Kuze et al. and U.S. Pat. No. 6,020,056 to Walker et al., both of which are hereby incorporated by reference in their entirety. Resin oligomer content can be reduced after melt-phase polymerization, for example, by thermally processing the resin at temperatures between the resin's glass transition and melting temperatures, such as during solid-state polymerization processes, resin annealing processes, oligomer extraction processes, and the like. Further oligomer development after such processing can be limited by, for example, reducing film processing temperatures and dwell times. Such grades of PET film tend to be more costly to manufacture than standard grades of PET films and are generally sold a premium.

SUMMARY

Applicants have discovered compositions and methods that provide flexible transparent conductive films that exhibit low levels of oligomer migration and haze development, without having to use costly substrates based on PEN film or low-oligomer content grades of PET film. Such flexible transparent conductive films can be used in electronic and optical applications.

At least a first embodiment provides flexible transparent conductive films comprising a transparent substrate comprising at least one first polyester comprising at least about 70 wt % ethylene terephthalate repeat units, the substrate further comprising a front side surface and a back side surface; at least one barrier layer disposed on the front side surface, the at least one barrier layer comprising at least one thermoplastic resin, and the at least one thermoplastic resin comprising at least one first cellulose ester polymer; and at least one transparent conductive layer disposed on the at least one barrier layer, the transparent conductive layer comprising at least one second cellulose ester polymer, where the film comprises a Delta Haze measurement less than about 1%.

In some such embodiments, the at least one first polyester may comprise polyethylene terephthalate with at least about 0.6 wt % extractable oligomer content, the at least one first cellulose ester polymer may comprise at least one cellulose acetate butyrate polymer, or the at least one thermoplastic resin may comprise at least one second polyester having less than one unsaturated carbon-carbon bond per ten repeat units. In some cases, the at least one transparent conductive layer may comprise at least one silver nanowire. The at least one second cellulose ester polymer may, for example, comprise at least one cellulose acetate butyrate polymer.

In some cases, such films may further comprise at least one hardcoat layer disposed on the back side surface comprising at least one radiation curable monomer.

Such films may comprise a Delta Haze measurement less than about 0.5%. In some cases, such films comprise Delta Haze measurements that are about the same as those of polyethylene naphthalate films.

At least a second embodiment provides flexible transparent conductive films comprising: a transparent substrate comprising at least one first polyester comprising at least about 70 wt % ethylene terephthalate repeat units, where the substrate further comprises a front side surface and a back side surface; at least one barrier layer disposed on the front side surface, where the at least one barrier layer comprises at least one thermoplastic resin; and at least one transparent conductive layer disposed on the at least one barrier layer.

The at least one first polyester may, for example, comprise polyethylene terephthalate (PET), such as, for example, PET with at least about 0.6 wt % extractable oligomer content.

The at least one thermoplastic resin may, for example, comprise at least one cellulosic polymer, such as, for example, at least one cellulose acetate butyrate polymer. Or the at least one thermoplastic resin may, for example, comprise at least one second polyester, such as, for example, at least one linear substantially saturated polyester. Or the at least one thermoplastic resin may, for example, comprise at least one cellulosic polymer and at least one second polyester.

The at least one transparent conductive layer may, for example, comprise at least one metal nanostructure, such as, for example, at least one silver nanowire. Or the at least one transparent conductive layer may, for example, comprise at least one cellulosic polymer, such as, for example, at least one cellulose acetate butyrate polymer. Or the at least one transparent conductive layer may, for example, comprise at least one metal nanostructure and at least one cellulosic polymer.

In at least some embodiments, the flexible transparent conductive film further comprises at least one hardcoat layer disposed on the back side surface of the transparent substrate. The at least one hardcoat layer may, for example, comprise at least one radiation curable monomer. Or the at least one hardcoat layer may, for example, comprise at least one cellulosic polymer, such as, for example, at least one cellulose acetate butyrate polymer.

Some embodiments provide flexible transparent conductive films comprising Delta Haze measurements less than about 5%, or less than about 1%, or less than about 0.5%. In some cases, such films comprise Delta Haze measurements that are about the same as those of polyethylene naphthalate films.

Still other embodiments provide articles comprising such flexible transparent conductive films. Non-limiting examples of such articles include electronic displays, touch screens, portable telephones, cellular telephones, computer displays, laptop computers, tablet computers, point-of-purchase kiosks, music players, televisions, electronic games, electronic book readers, transparent electrodes, solar cells, light emitting diodes, other electronic devices, medical imaging devices, medical imaging media, and the like.

These embodiments and other variations and modifications may be better understood from the description, exemplary embodiments, examples, and claims that follow. Any embodiments provided are given only by way of illustrative example. Other desirable objectives and advantages inherently achieved may occur or become apparent to those skilled in the art.

DESCRIPTION

All publications, patents, and patent documents referred to in this document are incorporated by reference herein in their entireties, as though individually incorporated by reference.

U.S. provisional application No. 61/488,831, filed May 23, 2011, entitled TRANSPARENT CONDUCTIVE FILMS, METHODS, AND ARTICLES, is hereby incorporated by reference in its entirety.

Transparent Substrates

At least some embodiments provide flexible transparent conductive films comprising transparent substrates that comprise at least one first polyester. The at least one first polyester may, for example, comprise at least about 70 wt % ethylene terephthalate repeat units. Or it may comprise at least about 75 wt %, or at least about 80 wt %, or at least about 85 wt %, or at least about 90 wt % or at least about 95 wt % ethylene terephthalate repeat units.

Such polyesters may, for example, be made through condensation polymerization of one or more monomers comprising acid or ester moieties with one or more monomers comprising alcohol moieties. Non-limiting examples of monomers comprising acid or ester moieties include, for example, aromatic acids or esters, aliphatic acids or esters, and non-aromatic cyclic acids or esters. Exemplary monomers comprising acid or ester moieties include, for example, terephthalic acid, dimethyl terephthalate, isophthalic acid, dimethyl isothphalate, phthalic acid, methyl phthalate, trimellitic acid, trimethyl trimellitate, naphthalene dicarboxylic acid, dimethyl naphthalate, adipic acid, dimethyl adipate, azelaic acid, dimethyl azelate, sebacic acid, dimethyl sebacate, and the like. Exemplary monomers comprising alcohol moieties include, for example, ethylene glycol, propanediol, butanediol, hexanediol, neopentyl glycol, diethylene glycol, cyclohexanedimethanol, and the like.

Such polyesters may, for example, comprise repeat units comprising a first residue from a monomer comprising acid or ester moieties joined by an ester linkage to a second residue from a monomer comprising alcohol moieties. Exemplary repeat units are, for example, ethylene terephthalate, ethylene isophthalate, ethylene naphthalate, diethylene terepthalate, diethylene isophthalate, diethylene naphthalate, cyclohexylene terephthalate, cyclohexylene isophthalate, cyclohexylene naphthalate, and the like. Such polyesters may comprise more than one type of repeat group and may sometimes be referred to as copolyesters.

Such polyesters generally comprise polymer chains that have a distribution of chain lengths. Some chains may be linear, others non-linear. Some chains may be cyclic, that is, comprised of several repeat units that form at least one cycle, or they may be acyclic, where the repeat units between any two chain ends do not form a cycle.

Chains comprising a relatively small number of repeat units, whether cyclic or acyclic, are often referred to as oligomers, or they may be referred to by a specific name, such as "trimer" to refer to oligomers with three repeat units or "tetramer" to refer to oligomers with four repeat units. Such oligomers may, for example, be the natural product of chemical equilibration during high temperature melt-phase polymerization or high temperature manufacture of a polyester film.

The polyester may, in some cases, exhibit at least about 0.6 wt % extractable oligomer content. Polyester oligomeric content may be directly measured by chemically extracting low molecular weight species from a film. For example, U.S. Pat. No. 6,020,056 to Walker et al., which is hereby incorporated by reference in its entirety, discloses gravimetric determination of extractable oligomer content by comparing the weights of a polyester film before and after immersing the film in boiling xylene for 24 hrs.

Barrier Layers

At least some embodiments provide at least one barrier layer disposed on the front side surface of the transparent substrate, where the barrier layer comprises at least one thermoplastic resin.

The at least one thermoplastic resin may, for example, comprise at least one cellulosic polymer. Cellulosic polymers are polysaccharides or derivatives of polysaccharides, that may have degrees of polymerization of, for example, 100, 1000, 10,000, or more. These include derivatives of cellulose, such as, for example, esters and ethers of cellulose. Cellulose ester polymers (also referred to as "cellulosic esters") include cellulose acetates, such as, for example, cellulose acetate, cellulose triacetate, cellulose propionate, cellulose acetate propionate, cellulose acetate butyrate (CAB), and the like. Cellulosic ether polymers (also referred to as "cellulose ethers") include, for example, methylcellulose, ethylcellulose, ethyl methyl cellulose, hydroxyethyl cellulose, hydroxypropyl cellulose, hydroxyethyl methyl cellulose, hydroxypropyl methyl cellulose, ethyl hydroxyethyl cellulose, carboxymethyl cellulose, and the like. These and other such cellulosic polymers will be understood by those skilled in the art.

The at least one thermoplastic resin may, for example, comprise at least one second polyester. Polyester resins may comprise, for example, aliphatic polyesters, aromatic polyesters, aliphatic copolyesters, aromatic copolyesters, or copolyesters having a combination of aliphatic and aromatic repeat units. Exemplary polyester resins are polyethylene terephthalate, polyethylene naphthalate, polybutylene terephthalate, poly(ε-caprolactone), poly(glycolide), poly(lactide), poly (lactide-co-glycolide), and the like.

In at least some embodiments, the thermoplastic resin may, for example, comprise at least one linear substantially saturated polyester. Some polyester resins may possess some extent of unsaturation, with double or triple carbon-carbon bonds being included for polymerization or crosslinking by thermal or radiation curing. Other polyester resins may be substantially saturated, and may, for example, comprise less than one unsaturated carbon-carbon bond for every ten or more of its repeat units.

Transparent Conductive Layers

At least some embodiments provide at least on transparent conductive layer disposed on the at least one barrier layer. In at least some embodiments, the transparent conductive layer may comprise at least one metal nanostructure.

In at least some embodiments, the at least one metal nanostructure may comprise at least one nanowire, nanocube, nanorod, nanopyramid, or nanotube, or the at least one metal nanoparticle comprises at least one nanowire. The at least one metal nanostructure may, for example, comprise at least one coinage metal, such as, for example, silver. An exemplary metal nanostructure is a silver nanowire. Conductive layers comprising nanowires are described in, for example, European Patent Application Publication EP 1 965 438, published Sep. 3, 2008, which is hereby incorporated by reference in its entirety.

The at least one transparent conductive layer may, for example, comprise at least one cellulosic polymer. Cellulosic polymers are polysaccharides or derivatives of polysaccharides, that may have degrees of polymerization of, for example, 100, 1000, 10,000, or more. These include derivatives of cellulose, such as, for example, esters and ethers of cellulose. Cellulosic esters include cellulose acetates, such as, for example, cellulose acetate, cellulose triacetate, cellulose propionate, cellulose acetate propionate, cellulose acetate butyrate (CAB), and the like. Cellulosic ethers include, for example, methylcellulose, ethylcellulose, ethyl methyl cellulose, hydroxyethyl cellulose, hydroxypropyl cellulose, hydroxyethyl methyl cellulose, hydroxypropyl methyl cellulose, ethyl hydroxyethyl cellulose, carboxymethyl cellulose, and the like. These and other such cellulosic polymers will be understood by those skilled in the art.

In at least some embodiments, the at least one transparent conductive layer may have a surface resistivity of less than about 150 ohms/sq, or less than about 125 ohms/sq, or less than about 100 ohms/sq, or less than about 75 ohms/sq, or less than about 65 ohms/sq, such as, for example, a surface resistivity of about 110 ohms/sq or a surface resistivity of about 60 ohms/sq.

Hardcoat Layers

At least some embodiments provide at least one hardcoat layer ("hardcoat") disposed on the back side surface of the transparent substrate. At least some hardcoats may be radiation curable hardcoats, such as, for example, an ultraviolet (UV) curable hardcoat. Such UV curable hardcoats are known. See, for example, Koleske, J. V., *Coatings Technology*, 1997, 69(866), 29; U.S. Pat. No. 7,339,793; and US patent application publication 2009/0274902; each of which is hereby incorporated by reference in its entirety. UV curable hardcoats may, for example, comprise monomeric or functional acrylates. Monomeric and functional acrylates can have molecular weights of 10,000 g/mol or less, typically 5,000 g/mol or less. UV curable hardcoats may, for example, comprise unsaturated polyesters. Unsaturated polyesters can attain high molecular weights and high crosslink densities upon exposure to ultraviolet radiation, which can result in improved coating durability.

In at least some embodiments, the at least one hardcoat layer comprises at least one radiation curable monomer. Radiation curable monomers are known. These may, for example, comprise monomers with one or more acrylic or methacrylic groups, such as, for example, polyfunctional monomers with two, three, four, five, six, or more polymerizable groups. At least some unsaturated polyesters or their oligomers may be radiation curable monomers. In some cases, radiation curable monomers may be polymerized or crosslinked in the presence of light, such as, for example, ultraviolet light at wavelengths of, for example, about 246 nm or about 280 nm. Dipentaerythritol pentaacrylate (DPPA) is an exemplary radiation curable monomer. These and other such monomers will be understood by those skilled in the art.

Curing may be aided through use of photoinitiators, such as, for example, 1-hydroxycyclohexylphenyl ketone, or crosslinkers, such as, for example hexamethoxymethylmelamine. These and other curing aids will be understood by those skilled in the art.

In at least some embodiments, the at least one hardcoat layer comprises at least one cellulosic polymer. Cellulosic polymers are polysaccharides or derivatives of polysaccharides, that may have degrees of polymerization of, for example, 100, 1000, 10,000, or more. These include derivatives of cellulose, such as, for example, esters and ethers of cellulose. Cellulosic esters include cellulose acetates, such as, for example, cellulose acetate, cellulose triacetate, cellulose propionate, cellulose acetate propionate, cellulose acetate butyrate (CAB), and the like. Cellulosic ethers include, for example, methylcellulose, ethylcellulose, ethyl methyl cellulose, hydroxyethyl cellulose, hydroxypropyl cellulose, hydroxyethyl methyl cellulose, hydroxypropyl methyl cellulose, ethyl hydroxyethyl cellulose, carboxymethyl cellulose, and the like. These and other such cellulosic polymers will be understood by those skilled in the art.

Films Comprising Low Delta Haze

In at least some embodiments, the transparent conductive film has a total light transmission of at least about 80%, or of at least about 85%. Or the transparent conductive films have ASTM D-1003 haze values of less than about 10%, such as, for example, haze values of about 9.38% or haze values of about 5.22%.

Percent haze of films may be measured, for example, using a BYK Gardner Hazegard instrument, according to ASTM method D-1003. Films may be hung in a 150° C. oven under an air atmosphere for 60 minutes. Percent haze may then be measured after the heat treatment and a Delta Haze measurement calculated as the difference of the post-treatment and pre-treatment percent haze numbers.

In at least some embodiments, the transparent conductive film has a Delta Haze measurement less than about 5%, or less than about 1%, or less than about 0.5%.

In some cases, the Delta Haze measurement is about the same as that of polyethylene naphthalate (PEN) film. Comparative Example 4, below, presents Delta Haze measurements for four commercial PEN films that range from 0.06% to 0.44%. Examples 1-3, below, show numerous examples of films that exhibit Delta Haze measurements from −0.06% to 0.35%. Performance of these films would be considered to be about the same as that of PEN films.

Articles Comprising Transparent Conductive Films

Some embodiments provide articles comprising flexible transparent conductive films. Such articles may, for example, comprise electronic displays, touch screens, and the like, for use in such applications as portable telephones, cellular telephones, computer displays, laptop computers, tablet computers, point-of-purchase kiosks, music players, televisions, electronic games, electronic book readers, and the like. These and other such articles will be understood by those skilled in the art.

EXEMPLARY EMBODIMENTS

U.S. provisional application No. 61/488,831, filed May 23, 2011, entitled TRANSPARENT CONDUCTIVE FILMS, METHODS, AND ARTICLES, which is hereby incorporated by reference in its entirety, disclosed the following 21 non-limiting exemplary embodiments:

A. A flexible transparent conductive film comprising:
a transparent substrate comprising at least one first polyester comprising at least about 70 wt % ethylene terephthalate repeat units, said substrate further comprising a front side surface and a back side surface;

at least one barrier layer disposed on the front side surface, said at least one barrier layer comprising at least one thermoplastic resin; and at least one transparent conductive layer disposed on the at least one barrier layer.

B. The film according to embodiment A, wherein the at least one first polyester comprises polyethylene terephthalate.

C. The film according to embodiment A, wherein the at least one first polyester comprises polyethylene terephthalate with at least about 0.6 wt % extractable oligomer content.

D. The film according to embodiment A, wherein the at least one thermoplastic resin comprises at least one cellulosic polymer.

E. The film according to embodiment A, wherein the at least one thermoplastic resin comprises at least one cellulose acetate butyrate polymer.

F. The film according to embodiment A, wherein the at least one thermoplastic resin comprises at least one second polyester.

G. The film according to embodiment A, wherein the at least one thermoplastic resin comprises at least one linear substantially saturated polyester.

H. The film according to embodiment A, wherein the at least one transparent conductive layer comprises at least one metal nanostructure.

J. The film according to embodiment A, wherein the at least one transparent conductive layer comprises at least one silver nanowire.

K. The film according to embodiment A, wherein the at least one transparent conductive layer comprises at least one cellulosic polymer.

L. The film according to embodiment A, wherein the at least one transparent conductive layer comprises at least one cellulose acetate butyrate polymer.

M. The film according to embodiment A, further comprising at least one hardcoat layer disposed on the back side surface.

N. The film according to embodiment M, wherein the at least one hardcoat layer comprises at least one radiation curable monomer.

P. The film according to embodiment M, wherein the at least one hardcoat layer comprises at least one cellulosic polymer.

Q. The film according to embodiment M, wherein the at least one hardcoat layer comprises at least one cellulose acetate butyrate polymer.

R. The film according to embodiment A comprising a Delta Haze measurement less than about 5%.

S. The film according to embodiment A comprising a Delta Haze measurement less than about 1%.

T. The film according to embodiment A comprising a Delta Haze measurement less than about 0.5%.

U. The film according to embodiment A comprising a Delta Haze measurement that is about the same as that of polyethylene naphthalate film.

V. An article comprising the film according to embodiment A.

W. The article according to embodiment V comprising at least one of an electronic display, a touch screen, a portable telephone, a cellular telephone, a computer display, a laptop computer, a tablet computer, a point-of-purchase kiosk, a music player, a television, an electronic game, an electronic book reader, a transparent electrode, a solar cell, a light emitting diode, an electronic device, medical a medical imaging device, or a medical imaging medium.

EXAMPLES

Materials

Unless otherwise noted, materials were available from Sigma-Aldrich, Milwaukee, Wis.

CYMEL® 303 is a hexamethoxymethylmelamine crosslinker (Cytec).

DESMODUR® BL 3370 MPA is a 70% solution of a blocked aliphatic polyisocyanate based on hexamethylene diisocyanate in propylene glycol monomethyl ether acetate (Bayer).

EASTMAN® CA 398-50 is a cellulose acetate polymer (Eastman Chemical).

EASTMAN® CAB 171-15i is a cellulose acetate butyrate polymer (Eastman Chemical).

EASTMAN® CAB 551-0.2 is a cellulose acetate butyrate polymer (Eastman Chemical).

EASTMAN® CAP 482-20 is a cellulose acetate propionate polymer (Eastman Chemical).

EPON™ 1031 is an epoxy resin (Momentive).

PIOLOFORM® PVB BL16 is a polyvinyl butyral resin (Kuraray).

POLYFOX™ PF-3320 is a fluorinated oxetane acrylate polymer surfactant (Omnova).

SARTOMER® SR399 is a dipentaerythritolpentaacrylate monomer (Sartomer Industries).

SKYNEX® NH10S and NX10 are polyethylene naphthalate films (SKC).

TEGO® Glide 410 is a polyether modified polysiloxane (Evonik).

TEONEX® Q65F and Q65FA are polyethylene naphthalate films (Teijin DuPont Films).

UCAR™ VYNS is a 90/10 vinyl chloride-vinyl acetate copolymer having an average molecular weight of 44,000 g/mol. (Dow Chemical).

VITEL® PE2200B is an amorphous, thermoplastic, high molecular weight, aromatic, linear saturated polyester resin. (Bostik).

VITEL® PE2700B is an amorphous, thermoplastic, linear saturated polyester (Bostik).

VITEL® PE2700B-LMW is a linear saturated polyester resin having a weight average molecular weight of 30,000-70,000 g/mol. (Bostik).

VITEL® PE5833 is a polyester resin (Bostik).

X-CURE™ 184 is a 1-hydroxycyclohexylphenone photoinitiator. (Dalian).

Example 1

Preparation of Hardcoat Coated PET Substrates

To a room temperature mixing vessel was charged 4625 g of methyl ethyl ketone (MEK) and 4625 g of butyl acetate, with moderate agitation. 750 g of EASTMAN® CAB 551-0.2 was slowly added to the vessel, taking care to avoid clumping. The vessel was covered to minimize evaporation and its contents were allowed to mix for 4 hrs. Mixing continued until samples of the vessel contents were homogeneous. The vessel contents were then filtered for use as Mixture A.

To a room temperature mixing vessel was charged 993.4 g of Mixture A. To this mixture was added 239.2 g of MEK, 239.2 g of butyl acetate, 172.0 g of SARTOMER® SR399, 224.0 g of CYMEL® 303, 69.2 g of a 16.7% solution of X-CURE™ 184 in 1 part benzophenone (Dalian) and 9 parts MEK, and 3.6 g of a 10% solution of POLYFOX™ PF-3320 in MEK, with agitation. To this mixture, 59.6 g of a 20% solution of p-toluenesulfonic acid monohydrate (Fisher) in denatured ethanol was slowly added. The vessel contents were allowed to mix for 30 min and then were filtered for use as the hardcoat coating mix.

The hardcoat coating mix was then coated on the back side of a 7-mil polyethylene terephthalate (PET) web, dried briefly under a hot air blower, and then cured under ultraviolet radiation, to provide a hardcoat layer with a dry coating weight of about 9 g/m². The coated web was slit to 10-inch width films having hardcoat layers on their back sides.

Preparation of Silver Nanowire Coating Mix

To a room temperature mixing vessel was charged 1296.25 g of n-propyl acetate (>99% purity) and 82.92 g cyclohexanone (>99% purity), with moderate agitation. The set-point temperature of the mixing vessel was increased to 52° C. 119.33 g of EASTMAN® CAB 171-15i was slowly added to the vessel, taking care to avoid clumping. To the vessel was then charged 0.598 g of phthalazone (99% purity, Aldich). The vessel was covered to minimize evaporation and its contents were allowed to mix for 4 hrs. Mixing continued until samples of the vessel contents were homogeneous. The vessel contents were then filtered for use as Mixture B.

To a room temperature mixing vessel was charged 1499.11 g of Mixture B, to which was added a mixture of 34.98 g of DESMODUR® BL 3370 MPA and 40 g of n-propyl acetate, with moderate agitation. To the agitated vessel was then charged a mixture of 10.88 g of bismuth neodecanoate (>99% purity, Aldrich) and 20 g of n-propyl acetate, followed by a mixture of 2.04 g of TEGO® Glide 410 and 10 g of n-propyl acetate, and then by 140 g of n-propyl acetate. The contents of the vessel continued to be mixed for 15 min. To the vessel was then added 150 g of ethyl lactate (>99% purity), which was allowed to mix for 10 min. Over ten minutes, 1500.0 g of a 2.5% slurry of silver nanowires in isopropanol (>98% purity) was added to the vessel and dispersed. After 15 min, the vessel contents were filtered for use as the silver nanowire coating mix.

Preparation of Coated Films

Either uncoated 7-mil PET films or the PET films having hardcoat layers on their backsides were used as substrates.

Barrier layer coating mixes were prepared as 5% solutions of various resins in methyl ethyl ketone (MEK), using the resins listed in Table I. On the front sides of some of the substrates, barrier layer coating mixes were coated using a #6 Mayer rod and dried to achieve a dry coating weight of 0.4 g/m². The front sides of the remaining substrates had no barrier layer coating applied.

The silver nanowire dispersion was then applied on the front sides of the substrates, either over the barrier layer or over the uncoated substrate, and dried at 135° C. for five minutes to produce coated films for evaluation. The dry coating thickness of the barrier layers was 0.7 µm.

Coated Film Evaluation

Percent haze of the coated films was measured using a BYK Gardner Hazegard instrument, according to ASTM method D-1003. The films were then hung in a 150° C. oven under an air atmosphere for 60 minutes. Percent haze was then measured after the heat treatment and a Delta Haze measurement calculated as the difference of the post-treatment and pre-treatment percent haze numbers.

Table I summarizes the results. Sample 1-13, which had no barrier layer, no silver nanowire layer, and no backcoat layer, had the highest Delta Haze measure, followed by Sample 1-12, which had a backcoat layer, but no barrier layer and no silver nanowire layer, followed by Sample 1-11, which had a backcoat layer and a silver nanowire layer, but no barrier layer. The uncoated side of Sample 1-12 was very dusty and cloudy. Coated films having barrier layers, silver nanowire layers, and backcoat layers exhibited low Delta Haze measurements, with the films with barrier layers comprising cellulosic polymers or polyesters exhibiting the smallest Delta Haze measurements.

TABLE I

| Sample ID | Barrier Layer Resin | Backcoat Layer | Delta Haze (%) |
|---|---|---|---|
| 1-1 | EASTMAN ® CAB 171-15i | Hardcoat | −0.01 |
| 1-2 | EASTMAN ® CA 398-60 | Hardcoat | 0.20 |
| 1-3 | EASTMAN ® CAP 482-20 | Hardcoat | 0.15 |
| 1-4 | VITEL ® PE2700B-LMW | Hardcoat | 0.13 |
| 1-5 | VITEL ® PE5833 | Hardcoat | 0.34 |
| 1-6 | VITEL ® PE2200B | Hardcoat | 0.07 |
| 1-7 | VITEL ® PE2700B | Hardcoat | 0.34 |
| 1-8 | EPON ™ 1031 | Hardcoat | 0.35 |
| 1-9 | UCAR ™ VYNS | Hardcoat | 0.83 |
| 1-10 | PIOLOFORM ® PVB BL16 | Hardcoat | 1.37 |
| 1-11 | No Barrier Layer | Hardcoat | 5.00 |
| 1-12 | No Barrier Layer No Nanowire Layer | Hardcoat | 5.49 |
| 1-13 | No Barrier Layer No Nanowire Layer | No Backcoat Layer | 8.53 |

Example 2

Barrier layer coating mixes were prepared from EASTMAN® CAB 171-15i and VITEL® PE2700B-LMW in methyl ethyl ketone (MEK), as listed in Table II. A resin-free MEK coating mix was prepared, as well.

The barrier layer coating mixes were coated on the front sides of 7-mil polyethylene terephthalate (PET) supports that also had hardcoat layers applied to their reverse sides, which were prepared according to the procedure of Example 1. Various barrier layer coating weights were used, as shown in Table II. Samples 2-1 through 2-9 were coated using a #4 Mayer rod, while the remaining samples were coated using a #6 Mayer rod. The barrier layer coatings were dried at 121° C. for 3 minutes.

Delta Haze was determined according to the procedure of Example 1. All barrier layer coatings containing the cellulosic polymer and polyester exhibited improved Delta Haze measurements relative to the 100% MEK control sample, even those with very light coating weights.

TABLE II

| Sample ID | Barrier Layer Cellulosic Content Dry Basis (wt %) | Barrier Layer Polyester Content Dry Basis (wt %) | Barrier Layer Total Solids Content (wt %) | Barrier Layer Dry Coating Weight (g/sq. m.) | Barrier Layer Dry Thickness (µm) | Delta Haze (%) |
|---|---|---|---|---|---|---|
| 2-1 | 70 | 30 | 4 | 0.358 | 0.4 | 0.01 |
| 2-2 | 70 | 30 | 3 | 0.227 | 0.3 | 0.17 |
| 2-3 | 70 | 30 | 1 | 0.032 | 0.01 | 0.25 |
| 2-4 | 80 | 20 | 4 | 0.358 | 0.4 | 0.29 |
| 2-5 | 80 | 20 | 3 | 0.227 | 0.3 | 0.26 |
| 2-6 | 80 | 20 | 1 | 0.032 | 0.01 | 0.31 |
| 2-7 | 90 | 10 | 4 | 0.358 | 0.4 | 0.18 |
| 2-8 | 90 | 10 | 3 | 0.227 | 0.3 | 0.17 |
| 2-9 | 90 | 10 | 1 | 0.032 | 0.01 | −0.06 |
| 2-10 | 90 | 10 | 1 | 0.042 | 0.2 | 0.12 |
| 2-11 | 80 | 20 | 0.50 | 0.021 | 0.08 | 0.17 |
| 2-12 | 80 | 20 | 0.20 | 0.008 | 0.03 | 0.09 |

TABLE II-continued

| Sample ID | Barrier Layer Cellulosic Content Dry Basis (wt %) | Barrier Layer Polyester Content Dry Basis (wt %) | Barrier Layer Total Solids Content (wt %) | Barrier Layer Dry Coating Weight (g/sq. m.) | Barrier Layer Dry Thickness (μm) | Delta Haze (%) |
|---|---|---|---|---|---|---|
| 2-13 | 80 | 20 | 0.10 | 0.004 | 0.02 | 0.07 |
| 2-14 | 80 | 20 | 0.05 | 0.002 | 0.008 | 0.14 |
| 2-15 | 80 | 20 | 0.01 | 0.0004 | 0.002 | 0.21 |
| 2-16 | 0 | 0 | 0 | n/a | n/a | 7.55 |

Example 3

Barrier-coated PET substrates were prepared according to the procedure of Example 2. The coating compositions and coating weights are shown in Table III. For three of the six samples, a silver nanowire coating mix was prepared and applied according to the procedure of Example 1.

Delta Haze was measured according to the procedure of Example 1, as summarized in Table III. Delta Haze was low compared to the control samples of Examples 1 and 2. The results also show that the performance of the barrier layers was not significantly adversely affected by the application of silver nanowires layers over the barrier layers.

TABLE III

| Sample ID | Barrier Layer Cellulosic Content Dry Basis (wt %) | Barrier Layer Polyester Content Dry Basis (wt %) | Barrier Layer Total Solids Content (wt %) | Barrier Layer Dry Coating Weight (g/sq. m.) | Silver Nanowire Coating? | Delta Haze (%) |
|---|---|---|---|---|---|---|
| 3-1 | 80 | 20 | 3.0 | 0.2270 | No | 0.21 |
| 3-2 | 80 | 20 | 1.5 | 0.1135 | No | −0.05 |
| 3-3 | 80 | 20 | 0.2 | 0.0084 | No | 0.14 |
| 3-4 | 80 | 20 | 3.0 | 0.2270 | Yes | 0.28 |
| 3-5 | 80 | 20 | 1.5 | 0.1135 | Yes | 0.12 |
| 3-6 | 80 | 20 | 0.2 | 0.0084 | Yes | 0.13 |

Example 4

Comparative

Four different polyethylene naphthalate (PEN) films were evaluated for Delta Haze according to the procedure of Example 1. No coatings were applied to the films as received.

SKYNEX® NH10S 7-mil PEN film exhibited a Delta Haze of 0.44%.

SKYNEX® NX10 2-mil PEN film exhibited a Delta Haze of 0.06%.

TEONEX® Q65F 4-mil PEN film exhibited a Delta Haze of 0.45%.

TEONEX® Q65FA 4-mil PEN film exhibited a Delta Haze of 0.28%.

A comparison of these results to those of Tables I-III demonstrates the ability of the inventive barrier-coated PET films to achieve similar Delta Haze levels as those exhibited by these PEN film samples.

The invention has been described in detail with reference to a presently preferred embodiment, but it will be understood that variations and modifications can be effected within the spirit and scope of the invention. The presently disclosed embodiments are therefore considered in all respects to be illustrative and not restrictive. The scope of the invention is indicated by the appended claims, and all changes that come within the meaning and range of equivalents thereof are intended to be embraced therein.

What is claimed:

1. A flexible transparent conductive film comprising:
a transparent substrate consisting of polyethylene terephthalate (PET) with at least about 0.6 wt % extractable oligomer content, said substrate further comprising a front side surface and a back side surface;
at least one barrier layer disposed on the front side surface, said at least one barrier layer comprising at least one thermoplastic resin, and the at least one thermoplastic resin comprising at least one first cellulose ester polymer; and
at least one transparent conductive layer disposed on the at least one barrier layer, the transparent conductive layer comprising at least one second cellulose ester polymer, wherein the PET has not been solid-state polymerized, and further wherein the film comprises a Delta Haze measurement less than about 1%.

2. The film according to claim 1, wherein the at least one first cellulose ester polymer comprises at least one cellulose acetate butyrate polymer.

3. The film according to claim 1, wherein the at least one thermoplastic resin further comprises at least one second polyester having less than one unsaturated carbon-carbon bond per ten repeat units.

4. The film according to claim 1, wherein the at least one transparent conductive layer comprises at least one silver nanowire.

5. The film according to claim 1, wherein the at least one second cellulose ester polymer comprises at least one cellulose acetate butyrate polymer.

6. The film according to claim 1, further comprising at least one hardcoat layer disposed on the back side surface comprising at least one radiation curable monomer.

7. The film according to claim 1 comprising a Delta Haze measurement less than about 0.5%.

8. The film according to claim 1 comprising a Delta Haze measurement that is about the same as that of polyethylene naphthalate film.

9. The film according to claim 1, wherein the PET has not undergone any post-melt polymerization oligomer reduction processes.

* * * * *